United States Patent
Varache

(10) Patent No.: US 9,755,102 B2
(45) Date of Patent: Sep. 5, 2017

(54) METHOD AND EQUIPMENT FOR TREATING A PRECURSOR OF A HETEROJUNCTION PHOTOVOLTAIC CELL AND ASSOCIATED METHOD FOR PRODUCING A PHOTOVOLTAIC CELL

(71) Applicant: COMMISSARIAT A L'ENERGIE ATOMIQUE ET AUX ENERGIES ALTERNATIVES, Paris (FR)

(72) Inventor: Renaud Varache, Cognin (FR)

(73) Assignee: COMMISSARIAT A L'ENERGIE ATOMOIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/304,731

(22) PCT Filed: Mar. 23, 2015

(86) PCT No.: PCT/EP2015/056149
§ 371 (c)(1),
(2) Date: Oct. 17, 2016

(87) PCT Pub. No.: WO2015/161966
PCT Pub. Date: Oct. 29, 2015

(65) Prior Publication Data
US 2017/0047473 A1    Feb. 16, 2017

(30) Foreign Application Priority Data
Apr. 25, 2014   (FR) ..................... 14 53743

(51) Int. Cl.
*H01L 31/20* (2006.01)
*H01L 31/0747* (2012.01)
*H01L 31/18* (2006.01)

(52) U.S. Cl.
CPC ........ *H01L 31/208* (2013.01); *H01L 31/0747* (2013.01); *H01L 31/1864* (2013.01); *Y02E 10/50* (2013.01); *Y02P 70/521* (2015.11)

(58) Field of Classification Search
CPC combination set(s) only.
See application file for complete search history.

(56) References Cited

U.S. PATENT DOCUMENTS

2005/0230822 A1* 10/2005 Tran ................ G11C 13/02
257/735
2013/0298985 A1* 11/2013 Darvish ................ C30B 23/04
136/256

(Continued)

FOREIGN PATENT DOCUMENTS

FR     2 977 079 A1    12/2012
NO     2013/001440 A1    1/2013

OTHER PUBLICATIONS

Mishima et al., "Development status of high-efficiency HIT solar cells", Solar Energy Materials & Solar Cells, vol. 95, No. 1, 2011, pp. 18-21; in English.

(Continued)

*Primary Examiner* — Mamadou Diallo
(74) *Attorney, Agent, or Firm* — Westerman, Hattori, Daniels & Adrian, LLP

(57) ABSTRACT

The precursor comprises at least one layer of doped crystalline silicon and a layer of doped amorphous semiconductor material. The method comprises the steps of placing the cell precursor sandwiched between a grounded conducting plate and a plate made of insulating material coated with a conducting layer, then applying a state change electrical voltage (U1) between the conducting layer and ground, the said state change electrical voltage (U1) being designed to bring the Fermi level at the interface between crystalline silicon and amorphous semiconductor material closer to the (Continued)

middle of the band gap of the said amorphous semiconductor material, while at the same time heating the cell precursor to a defect equilibration temperature ($T_E$), and finally cooling down the cell precursor (10) prior to interrupting the application of the state change electrical voltage (U1).

20 Claims, 3 Drawing Sheets

(56) References Cited

U.S. PATENT DOCUMENTS

| | | |
|---|---|---|
| 2015/0013758 A1 | 1/2015 | Harrison et al. |
| 2016/0071994 A1* | 3/2016 | Bosco ............... H01L 31/02246 136/252 |
| 2016/0285021 A1* | 9/2016 | Yang ........................ B05D 1/60 |

OTHER PUBLICATIONS

Tanaka et al., "Development of New a-Si/c-Si Heterojunction Solar Cells: ACJ-HIT (Artificially Constructed Junction-Heterojunction with Intrinsic Thin-Layer)", Japanese Journal of Applied Physics, vol. 31, No. 11, 1992, pp. 3518-3522; in English.

Powell et al., "Defect-pool model and the hydrogen density of states in hydrogenated amorphous silicon", Pysical Review B, vol. 53, No. 15, Apr. 15, 1996, pp. 10121-10132; in English.

International Search Report and Written Opinion dated Jun. 9, 2015 issued in corresponding application No. PCT/EP2015/056149; w/ English partial translation and partial machine translation (18 pages).

* cited by examiner

METHOD AND EQUIPMENT FOR TREATING A PRECURSOR OF A HETEROJUNCTION PHOTOVOLTAIC CELL AND ASSOCIATED METHOD FOR PRODUCING A PHOTOVOLTAIC CELL

The invention relates to a method for processing a precursor of a heterojunction photovoltaic cell aimed at improving the conversion efficiency of this cell.

A silicon heterojunction photovoltaic cell generally associates crystalline silicon and amorphous silicon. It is fabricated starting from a wafer of crystalline silicon (c-Si), onto which, after cleaning, one or more layer(s) of amorphous silicon (a-Si) is deposited on each of the faces of the wafer. The amorphous silicon may for example be hydrogenated amorphous silicon (a-Si:H). Generally speaking, the layer of crystalline silicon is of the N type, whereas the layer or layers of amorphous silicon are of the P type on one side, and of the N type on the other. However, any other combination of the N and/or P types may be envisioned. A layer of a transparent electrically-conducting oxide (TCO—Transparent Conductive Oxide) is subsequently deposited onto at least one face. More generally, the TCO may be replaced by a transparent conductive material on the front face, and by an electrically-conducting material on the back face (transparent or otherwise). Lastly, metallizations are carried out in order to form electrical contacts.

The quality of the interface between the amorphous silicon and the crystalline silicon is determinant in optimizing the performance characteristics of the cell, notably its conversion efficiency.

Indeed, during the operation of the photovoltaic cell, the light which is absorbed by the crystalline silicon generates electrons and holes allowing electricity to be produced. However, these electrons and these holes can recombine at the interface between the crystalline silicon and the amorphous silicon with non-passivated defects, typically unsaturated silicon bonds and/or impurities. The term 'interface' is understood to denote the first nanometer or nanometers of amorphous silicon adjoining the crystalline silicon in the region of separation between amorphous silicon and crystalline silicon. The recombination at the interface of the electrons and the holes which have been generated leads to the loss of these electrons and of these holes, which degrades the efficiency of the cell. This recombination of electrons and holes should therefore be limited by controlling the recombinant defects at the interface.

In order to improve the quality of the interface, a known solution is to deposit, between the crystalline silicon and the doped layer of amorphous silicon, an intermediate layer of intrinsic amorphous silicon. This layer of intrinsic amorphous silicon is initially of good quality: its Fermi level is close to the middle of the band gap and, as a consequence, its defect density is virtually a minimum. Indeed, according to the model known as 'defect pool model', the defect density in a semiconductor material depends on the position of the Fermi level of this material. Typically, according to this model, the defect density is minimized when the Fermi level is positioned in the middle, or substantially in the middle, of the gap. The purpose of the intrinsic layer deposited on the crystalline silicon is to reduce the defect density at the interface and hence to improve the efficiency of the cell.

However, during the fabrication of the cell, when the layer of P- (or N-)doped amorphous silicon is deposited on top of the layer of intrinsic amorphous silicon, this P- (or N-)doped layer forces the Fermi level of the intrinsic layer to move closer to the valence band (or to the conduction band). In any case, the P- (or N-)doped amorphous layer has an influence on the Fermi level of the intrinsic amorphous layer. In particular, its presence modifies the Fermi level of the intrinsic amorphous layer and brings it closer to the Fermi level of the same amorphous layer, but P- (or N-)doped. However, as this deposition of the P- (or N-)doped layer is carried out at a temperature close to a threshold temperature for equilibration of the defects in the amorphous silicon, this results in a modification of the defect density within the intrinsic layer which tends toward a defect density corresponding to the modified Fermi level.

Post-deposition (in other words after deposition of the layer of amorphous silicon) processing steps exist aimed at improving the quality of the interface between amorphous silicon and crystalline silicon.

These processing steps are mainly based on an annealing at temperature.

In particular, the document WO2013/001440 describes a post-deposition processing method for annealing at temperature under illumination, consisting in heating the photovoltaic cell to a temperature in the range between 20° and 200° C. while at the same time subjecting it to a given light intensity. The duration of such a processing step is generally several hours, which proves to be difficult to implement as it is too long from a production standpoint.

The present invention is intended to further improve the situation.

For this purpose, the invention relates to a method for processing a precursor of a heterojunction photovoltaic cell, the precursor comprising at least one layer of doped crystalline silicon and one layer of doped amorphous semiconductor material, characterized in that it comprises the following steps:

place the cell precursor sandwiched between a grounded conducting plate and a plate made of insulating material coated with a conducting layer;

apply a state change electrical voltage between the conducting layer and ground, the said state change electrical voltage being designed to bring the Fermi level at the interface between crystalline silicon and amorphous semiconductor material closer to the middle of the band gap of the said amorphous semiconductor material, while at the same time heating the cell precursor to a defect equilibration temperature;

cool down the cell precursor prior to interrupting the application of the state change electrical voltage.

According to the invention, the cell precursor is subjected to a heating step, under an applied electrical voltage. The cell precursor corresponds to a multilayer stack comprising at least one layer of doped crystalline silicon and one layer of amorphous semiconductor material, which may also be doped, micro-doped or intrinsic. It is furthermore designed to form a heterojunction photovoltaic cell. In any event, an interface, denoted INT, between crystalline silicon and amorphous semiconductor is disposed at the separation between the crystalline silicon and the amorphous semiconductor. The application of the state change electrical voltage across the terminals of the precursor has the effect of shifting the Fermi level bringing it closer to the middle of the band gap, at the interface INT. Under these conditions, the energy state of the interface INT is analogous to that of an intrinsic semiconductor. The heating then provides the energy necessary to cause an equilibration of the defects in the interface INT induced by the Fermi level positioned in the middle of the band gap or close to the latter. This results in a decrease in the defect density in the interface INT, which tends to stabilize at an equilibrium value of density which depends on the shifted Fermi level. This equilibrium density corresponds to the defect density of a perfectly intrinsic amorphous semiconductor. The precursor is subsequently cooled down, prior to the interruption of the application of the state change electrical voltage, in order to avoid an undesirable increase, a posteriori, in the defect density.

The method of the invention may comprise all or a part of the following additional features:

the equilibration temperature is higher than or equal to a threshold equilibration temperature for the defects below which the energy provided is insufficient to allow a modification of the defect density in the amorphous semiconductor;

the equilibration temperature is higher than or equal to 150° C;

the equilibration temperature is less than or equal to a maximum temperature beyond which the amorphous semiconductor would be degraded;

the equilibration temperature is less than or equal to a maximum temperature beyond which the amorphous semiconductor would be degraded, notably structurally modified;

the equilibration temperature is less than or equal to 300° C;

during the application of the state change electrical voltage, the cell precursor is heated to the equilibration temperature for an equilibration time, the temperature and equilibration time pair being chosen as a function of a desired efficiency, and in that, in order to determine the temperature and equilibration time pair, during a prior configuration phase, a plurality of test cell precursors are made available, analogous to the precursor of the cell to be fabricated and, for each test precursor, the steps are implemented for placing the said test precursor sandwiched between a grounded carrier and a plate made of insulating material coated with a conducting metal layer, for applying a state change electrical voltage between the conducting metal layer and ground, while at the same time heating the test precursor to an equilibration temperature, and for cooling down the test precursor prior to interrupting the application of the state change electrical voltage, the various test precursors being tested for various respective pairs of temperature and of equilibration time, then the efficiency of each test precursor is evaluated and the optimum temperature and equilibration time pair is selected corresponding to the best efficiency obtained;

the precursor is heated to the equilibration temperature with the state change electrical voltage applied for an equilibration time in the range between 1 and 30 minutes;

the assembly comprising the cell precursor, the conducting plate and the insulated plate coated with the conducting layer is placed in a vessel under a controlled atmosphere; to cool down the precursor, a cooling fluid is circulated within the vessel;

the insulating plate has a thickness greater than or equal to 100 nm.

The invention also relates to a method of fabrication of a heterojunction photovoltaic cell, characterized in that it comprises:

a step consisting in providing a cell precursor comprising at least one layer of doped crystalline silicon and one layer of doped amorphous semiconductor material and the implementation of a processing method such as previously defined, applied to said cell precursor fabrication equipment.

Advantageously, after cooling down the cell precursor and interruption of the state change electrical voltage, the fabrication method comprises a step for deposition of at least one layer of an electrically-conducting material and a metallization step in order to form electrical contacts.

The invention further relates to a piece of equipment for processing a precursor of a heterojunction photovoltaic cell, notably implemented during the fabrication of the cell, characterized in that it comprises a grounded conducting plate;

a plate made of insulating material coated with a conducting layer, the two plates being arranged so as to sandwich a photovoltaic cell precursor to be processed, the said precursor comprising at least one layer of doped crystalline silicon and one layer of doped amorphous semiconductor material;

a electrical voltage generator connected to the said conducting layer;

a heating device;

a cooling device;

a control module designed to control the operation of the electrical voltage generator, of the heating device and of the cooling device in such a manner as to apply a state change electrical voltage between the conducting layer and ground, the said state change electrical voltage being designed to bring the Fermi level at the interface between crystalline silicon and amorphous semiconductor material closer to the middle of the band gap of the said amorphous semiconductor material, while at the same time heating the cell precursor to a defect equilibration temperature, then to cool down the precursor prior to interrupting the application of the said state change electrical voltage.

The invention will be better understood by means of the following description of one particular embodiment of the method of fabrication of a heterojunction photovoltaic cell, with reference to the appended drawings in which.

Figure 1:
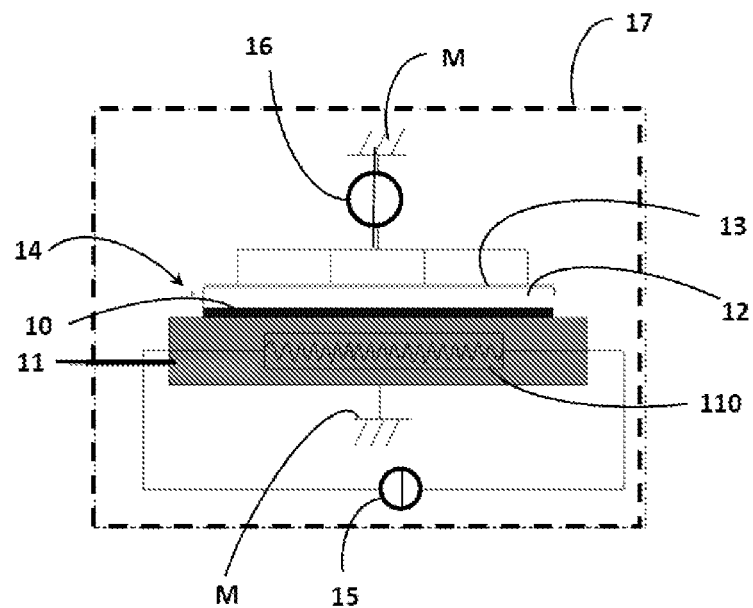
FIG. 1 shows a device for processing a cell precursor for the fabrication of a photovoltaic cell according to one particular embodiment of the invention.
Figure 2:
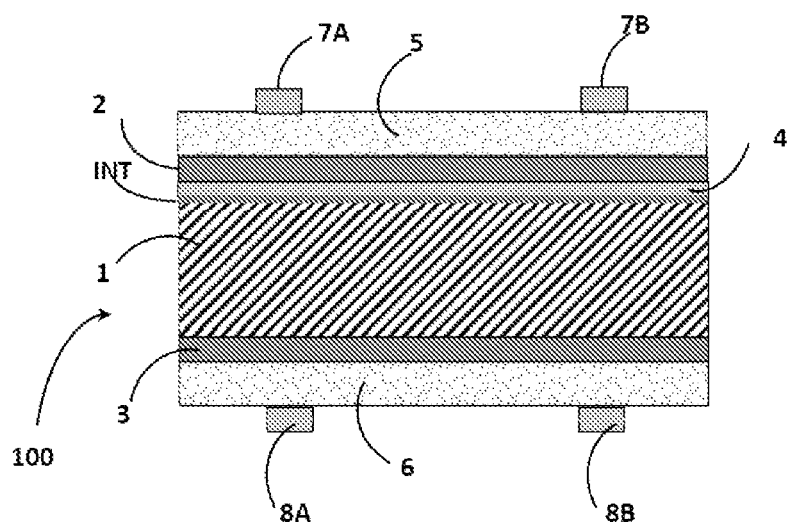
FIG. 2 shows a schematic view of the cell in cross-section.

The method of the invention relates to the fabrication of a heterojunction photovoltaic cell, referenced 100. It relates more particularly to the processing a cell precursor 10 adapted to the fabrication of the cell 100, which is aimed at improving the performance characteristics of the finished cell 100. This processing is implemented during the fabrication of the cell 100.

In the particular example described here, the heterojunction photovoltaic cell 100 is a cell said to be of the N type, in other words it comprises a central layer 1 of N-type doped crystalline silicon on which and under which are respectively disposed two layers 2 and 3 of an amorphous semiconductor material, for example of hydrogenated amorphous silicon. The central layer 1 is, in particular, formed starting from a substrate, in the present case a wafer, of crystalline silicon doped according to the N type. The material composing it is accordingly denoted (N) c-Si.

The amorphous layers 2 and 3 could be formed of a semiconductor material other than hydrogenated amorphous silicon, notably of an amorphous semiconductor alloy formed from silicon and from an element such as germanium, carbon, oxygen, etc.

At least one of the two layers of amorphous silicon 2, 3 is doped with a doping of the P or N type. In the particular exemplary embodiment described here, the top (or "front") layer 2 is doped with a doping of the P type and the bottom (or "back") layer 3 is doped with a doping of the N type. The materials composing the top layer 2 and the bottom layer 3 are denoted (P)a-Si:H and (N)a-Si:H, respectively.

Any other combination of stacking of layers of the P and/or N type may be envisioned within the scope of the invention. The bottom, or back, layer 3 could also be formed of an intrinsic semiconductor material. In any case, the cell comprises at least one layer of doped crystalline silicon (of the P or N type) carrying a layer of amorphous semiconductor, an interface INT being disposed at the separation between doped crystalline silicon and amorphous semiconductor.

By definition, an 'intrinsic' semiconductor material is an undoped semiconductor material, whose electrical behavior only depends on its structure, and not on the addition of impurities as in the case of a doping. In an intrinsic semiconductor material, the charge carriers are only created by crystalline defects or by thermal excitation. Furthermore, the Fermi level is close to the middle of the band gap (more particularly, slightly higher than the middle of the gap).

The photovoltaic cell 100 here also comprises an intermediate layer 4 of intrinsic semiconductor material, in the present case hydrogenated amorphous silicon denoted (i)a-Si:H, disposed between the central layer 1 and the top layer 2. This layer of intrinsic amorphous silicon is deposited directly on the central layer 1, in order to reduce the number of defects at the interface INT between amorphous silicon and crystalline silicon.

It could also be envisioned to deposit an intermediate layer of intrinsic amorphous semiconductor material under the central layer 1, between the latter and the bottom layer 3 of amorphous semiconductor material.

The intermediate layer or layers could be micro-doped, instead of being intrinsic.

The term 'interface INT' is understood here to denote a region situated at the separation between crystalline silicon and amorphous silicon which contains the first nanometer or nanometers of amorphous silicon, typically the first 2 or 3 nanometers, adjoining the crystalline silicon.

After having been deposited on the central layer 1, the layer of intrinsic amorphous silicon 4 is initially of good quality: its Fermi level is close to the middle of the band gap of the intrinsic amorphous silicon and, consequently, its defect density is minimized according to the predictions of the of 'defect-pool' model. For more detailed information on the 'defect-pool' model, the reader is invited to refer for example to the document "*Defect-pool model and the hydrogen density of states in hydrogenated amorphous silicon*", M. J. Powell and S. C. Deane, *Phys. Rev. B*, 53:10121-32, 1996. The purpose of the intrinsic layer 4, which is deposited on the crystalline silicon, is to reduce the defects at the interface INT and hence to improve the efficiency of the cell 100.

However, when the layer 2 of P-doped amorphous silicon is deposited on top of the layer 4 of intrinsic amorphous silicon, this P-doped layer forces the Fermi level of the intrinsic layer 4, and as a consequence of the interface INT, to come closer to the valence band, as if the intrinsic layer 4 were P-doped. This results in a modification of the Fermi level in the interface INT which comes closer to the valence level. However, as the deposition of the P-doped layer is carried out at a temperature close to or higher than a threshold temperature for equilibration of the defects, the defect density in the intrinsic layer 4, including in the interface INT, varies, and more particularly increases, until it reaches an equilibrium defect density which depends on the modified Fermi level.

Each layer of amorphous silicon 2 (respectively 3) is coated with a top, or front, layer 5 (respectively bottom, or back, layer 6) of a transparent conductive material, for example a transparent electrically-conducting oxide, or TCO (for 'Transparent Conductive Oxide').

The thicknesses of the layers may be as follows:
central layer 1 in the range between 50 and 200 μm,
layers 2 (doped amorphous silicon), 3 (doped amorphous silicon) and 4 (intrinsic silicon) each in the range between 1 and 40 nm,
layers 5 and 6 (conductive material) each in the range between 50 and 300 nm.

Lastly, top (or front) electrical contacts 7A, 7B are disposed on the free face of the top layer 5 of TCO, referred to as "front face" of the cell 100, and bottom (or back) electrical contacts 8A, 8B are disposed on the free face of the bottom layer 6 of TCO, referred to as "back face" of the cell 100.

It should be noted that, on the back face, the layer 6 is not necessarily transparent. For a cell of the bifacial type, the layer 6 has the same function as on the front face and is, in this case, transparent. For a cell of the mono-facial type, having a full-sheet metallization, the layer 6 provides a better contact on the amorphous silicon and does not need to be transparent. These layers 5 and 6 provide the lateral transport of the charges toward the electrical contacts or metallizations, front and back.

The invention allows the defect density to be reduced in the interface INT between crystalline silicon and amorphous silicon in the cell 100 by a thermal processing of this interface INT under an applied electrical voltage. This processing is applied during the fabrication of the cell 100.

Figure 6:
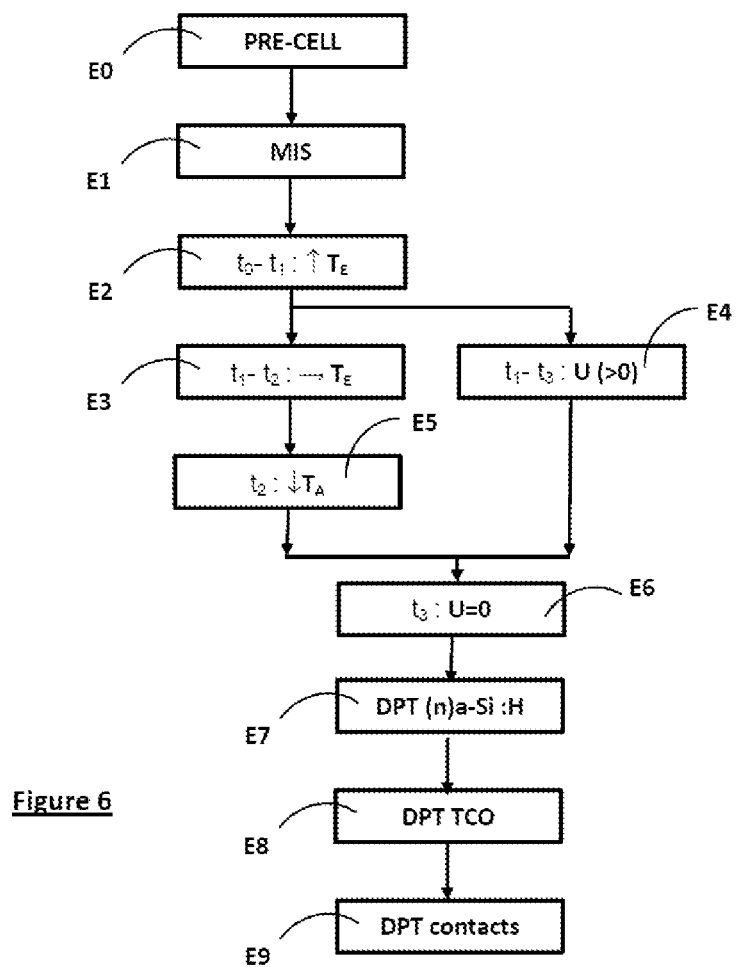
FIG. 6 shows a flow diagram of the steps of the method.

The method of fabrication of the cell 100, according to one particular embodiment of the invention, will now be described with reference notably to FIG. 6. For the sake of concision, only the steps relating to the invention will be detailed in the description that follows.

During an initial step E0, a cell precursor 10 is provided here comprising the stacking of the central layer 1 of crystalline silicon of the N type, of the layer of intrinsic amorphous silicon 4 and of the top layer 2 of amorphous silicon of the P type. The cell precursor 10 is formed in a known manner starting from a wafer of crystalline silicon of the N type on which the layer of intrinsic amorphous silicon 4 and the top layer 2 of amorphous silicon of the P type are successively deposited.

During a second step E1, the cell precursor 10 is sandwiched, in other words interposed, between a grounded conducting carrier plate 11 and a plate 12 made of insulating material coated with a conducting layer 13, as shown in FIG.

1. For example, the plate 12 is made of mica and the conducting layer 13 is of a metal or metal alloy. The carrier plate 11 here is a heating plate, incorporating a resistive heating element 110 connected to a current generator 15. The heating carrier plate 11 is designed to heat up the cell precursor 10.

The assembly comprising the conducting layer 13, the insulator 12 and the cell precursor 10 forms a structure 14 of the MIS (for 'Metal-Insulator-Semiconductor') type, in which the cell precursor 10 plays the role of the semiconductor of the MIS structure. This structure 14 is disposed on the carrier 11 which is connected to a reference potential, in the present case to ground M.

The conducting layer 13 is connected to an electrical voltage generator 16, by means of electrical contacts, not shown. The generator 16 is designed to apply a state change electrical voltage U1 between the conducting layer 13 and ground M (or the reference potential to which the carrier plate 11 is connected).

The MIS structure and the carrier plate 11 are placed in a vessel 17 under a controlled atmosphere, in which dihydrogen and/or dinitrogen circulates. It could also be envisioned to evacuate the vessel.

As a variant, the MIS structure 14 and the carrier plate 11 could be placed in an oven designed to heat the cell precursor 10. In this case, the carrier plate 11 would not be heated but would nevertheless be connected to ground M.

Figure 3:
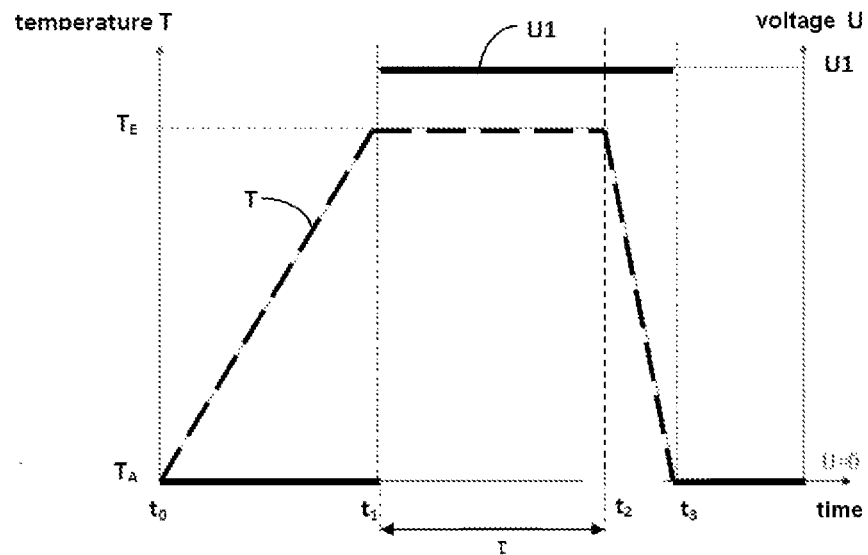
FIG. 3 shows the time variation of the temperature of the cell precursor and the time variation of the electrical voltage applied during the processing of the cell precursor.

After formation of the MIS structure, during a step E2, the cell precursor 10 is heated by means of the heating plate 11 whose resistive element is supplied with current by the generator 15. In FIG. 3, the time variation of the temperature T of the precursor 10 is shown by dashed lines. Initially, the temperature T of the precursor 10 is equal to ambient temperature $T_A$. The heater raises the temperature T of the precursor 10 from ambient temperature $T_A$ to an equilibration temperature $T_E$. The time of start of heating is denoted $t_0$ and $t_1$ the time at which the precursor 10 reaches the temperature $T_E$.

During a step E3, the heating continues in such a manner as to maintain the temperature T of the cell precursor 10 at the equilibration temperature $T_E$, until a time $t_2$. A temperature probe (not shown) connected to the metal carrier 11 allows the temperature T to be monitored and controls the operation of the current generator 15 supplying the resistive element 110 of the heating plate 11.

The equilibration temperature $T_E$ must be higher than an equilibration threshold temperature $T_{TSH}$. The 'equilibration threshold temperature' is understood to denote a minimum temperature starting from which the defects initially present in the amorphous silicon forming the layer 4 reach equilibrium, the energy provided by the heating being sufficient to cause chemical reactions, such as notably described in the document "*Defect-pool model and the hydrogen density of states in hydrogenated amorphous silicon*", M. J. Powell and S. C. Deane, *Phys. Rev. B*, 53:10121-32, 1996, which have the effect of reducing the defect density in the amorphous silicon. The equilibration temperature $T_E$ must also be less than a maximum temperature $T_{max}$ beyond which the heating would degrade the structure of the amorphous silicon and the interface INT, notably by crystallization and/or by effusion of hydrogen. The equilibration temperature $T_E$ can be in the range between 150° C. and 300° C.

U denotes the electrical voltage "across the terminals" of the MIS structure 14, in other words between the conducting metal layer 13 and ground M. Initially, at time $t_0$, the electrical voltage U is zero (U=0), as shown in FIG. 3. During a step E4, starting from time $t_1$, or shortly after this time $t_1$, the voltage generator 16 applies an electrical voltage U equal to a state change electrical voltage, denoted U1. This results in a non-zero electrical voltage "across the terminals" of the cell precursor 10 (in other words between the free top face of the layer 2 of amorphous silicon and the free bottom face of the layer 1 of crystalline silicon). Applying a voltage to the MIS structure 14 and, as a consequence, to the precursor 10, is carried out without causing current to flow by virtue of the insulator 12 which prevents it from flowing. The thickness of the insulator 12 must be greater than about 100 nm in order to avoid any leakage current.

The value U1 of the state change electrical voltage applied to the terminals of the cell precursor 10 is designed to modify the position of the Fermi level in the interface INT of the cell precursor 10 and to bring it closer to the middle of the band gap of the amorphous silicon. The 'band gap' denotes, in a known manner, the gap between the valence band and the conduction band of the semiconductor material, in the present case the hydrogenated amorphous silicon forming the intermediate layer 4. The state change electrical voltage U1 that should be applied in order shift the Fermi level up to the middle of the band gap or to a position close to the latter, also depends on the thickness of the insulator 12. The thicker the insulator 12 (the thickness of the insulator notably allowing a good mechanical strength of the layer 12 to be ensured), the higher must be the state change electrical voltage U1. Depending on the thickness of the insulator 12, the state change electrical voltage U1 can thus be in the range between a few tens of Volts and several thousand Volts. In order to determine the electrical voltage U1 to be applied, a value of electrical voltage U1 may be chosen such that the product C*U1, where C represents the electrical capacitance of the insulator of the MIS structure, is higher than $10^{12}$ charges per cm$^2$. This value of "$10^{12}$ charges per cm$^2$" indeed corresponds to around the fixed quantity of charges present in the layer 2 of doped hydrogenated amorphous silicon. However, it is this value of quantity of charges that must be made to vary in order to change the position of the Fermi level in the layer The phrase "close to the middle of the gap" is understood here to mean that the shifted position of the Fermi level, resulting from the application of the state change electrical voltage U1, denoted $E_F$ and expressed in eV, is such that:

$$\frac{(E_c - E_v)}{2} - 0.2 \leq E_F - E_v \leq \frac{(E_c - E_v)}{2} + 0.2$$

where $E_c$ and $E_v$ respectively denote the energy state of the lower limit of the conduction band, expressed in eV, and the energy state of the upper limit of the valence band, expressed in eV, in the hydrogenated amorphous silicon forming the layer 4;

$(E_c - E_v)$ corresponds to the height of the band gap between the valence band and the conduction band;

$E_F - E_v$ denotes the energy state, expressed in eV, of the Fermi level with respect to the valence band, corresponding to the "position" relative of the Fermi level with respect to the valence band (more particularly with respect to the upper limit of the valence band).

In other words, the Fermi level shifted by application of the state change electrical voltage U1 is in the range between the middle of the band gap decreased by 0.2 eV and the middle of the band gap increased by 0.2 eV.

In the particular exemplary embodiment described here, the band gap is 1.8 eV. The Fermi level shifted by application of the state change electrical voltage U1 is therefore in the range between 0.7 eV and 1.1 eV.

The sign of the state change electrical voltage U1 to be applied depends on the relative dopings of the layer 1 of crystalline silicon and of the layer of amorphous silicon 2. It must be adapted in order to bring the Fermi level closer to the middle of the band gap at the interface INT. For example, in the case of a layer 1 of crystalline silicon of the N type and of a layer 2 of hydrogenated amorphous silicon of the P type, the positive pole must be applied on the side of the layer 2. In other words, the state change electrical voltage (with respect to ground) applied by the generator 16 to the conducting plate 13 is positive.

The state change electrical voltage U1 is applied to the terminals of the precursor 10 (in other words between the conducting layer 13 and ground M), while at the same time heating and maintaining the cell precursor 10 at the temperature $T_E$ of equilibration of the defects, between time $t_1$ (or shortly after this time $t_1$) and time $t_2$. $\tau$ is used, with $\tau = t_2 - t_1$, to denote the equilibration time of the defects, corresponding to the time during which the precursor 10 is subjected both to the application of the state change electrical voltage U1 and to the heating to the temperature $T_E$. This duration can be in the range between 1 minute and 30 minutes, depending on the kinetics of equilibration of the defects.

During the period for equilibration of the defects of duration $\tau$ (in other words between the times $t_1$ and $t_2$), under the effect of the state change electrical voltage U1, the shifted Fermi level of the interface INT is close to the middle of the band gap of the amorphous silicon forming the interface INT. The Fermi level then has the same position as in intrinsic amorphous silicon. By virtue of the energy provided by the heating to the equilibration temperature $T_E$, the defect density within the interface INT reaches equilibrium as a function of the shifted Fermi level (in other words close to the middle of the gap). Since the shifted Fermi level corresponds to the Fermi level of intrinsic amorphous silicon, the density d of defects in the interface INT decreases toward an equilibrium defect density $d_E$ corresponding to the defect density in the intrinsic amorphous silicon. As previously explained, the equilibration of the defects takes place by chemical reactions such as described in the document "Defect-pool model and the hydrogen density of states in hydrogenated amorphous silicon", M. J. Powell and S. C. Deane, Phys. Rev. B, 53:10121-32, 1996. Thus, the application of the state change electrical voltage U1 to the terminals of the precursor 10 allows a virtual transformation, in terms of energy state, of the interface INT into an intrinsic semiconductor.

Figure 4:
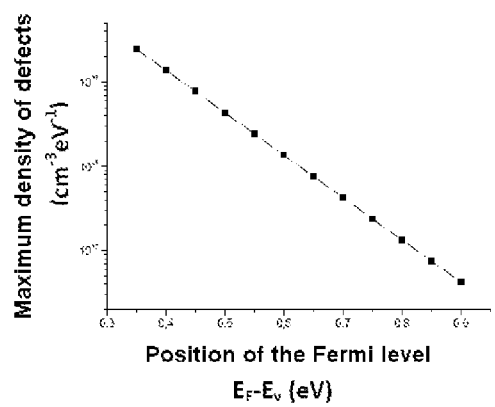
FIG. 4 shows the variation of the defect density in amorphous silicon as a function of the position of the Fermi level within the amorphous silicon, according to the predictions of the of 'defect-pool' model.

FIG. 4 shows the variation of the maximum density of defects in the amorphous silicon forming the layer 4 containing the interface INT (expressed in $cm^{-3} \cdot eV^{-1}$) as a function of the relative position of the Fermi level with respect to the valence band, in other words ($E_F - E_V$), expressed in eV, according to the predictions of the 'defect-pool' model. The curve in FIG. 4 shows that the defect density is a minimum when the Fermi level is positioned at 0.9 eV above the valence band, i.e. in the middle of the band gap whose height is 1.8V.

After the period for equilibration of the defects of duration $\tau$, the method continues with a step E5 for cooling down the cell precursor 10. This step E5 begins at time $t_2$ and ends at time $t_3$ when the precursor 10 has returned to ambient temperature $T_A$. The duration of the cooling (in other words the duration ($t_3 - t_2$)) may be of any given length. Preferably, it can be carried out rapidly, for example in less than 1 minute, by causing a cooling fluid, for example nitrogen $N_2$ at low temperature, to circulate within the vessel 17.

After cooling of the precursor 10, at time $t_3$ (or potentially at a later moment in time), the application of the state change electrical voltage U is interrupted, the electrical voltage across the terminals of the precursor 10 thus being reset to zero, during a step E6.

It should be noted that the cell precursor 10 should be cooled down prior to interrupting the state change electrical voltage U1, in order not to cause an a posteriori increase of the defect density. It could however be envisaged to interrupt the application of the state change electrical voltage before the temperature of the precursor 10 reaches the ambient temperature, as long as the temperature of the precursor 10 is lower than the equilibration threshold temperature $T_{TSH}$.

In order for the defect density in the interface INT to reach or to become close to the equilibrium density during the period of heating to temperature $T_E$ under an applied electrical voltage U1, referred to as 'equilibration period', an equilibration temperature and equilibration time pair $(T_E, \tau)$ should be chosen that defines a sufficient thermal budget to be provided to the cell precursor 10 and that allows a desired efficiency for the finished cell 100 to be obtained. In order to determine the temperature and equilibration time pair $(T_E, \tau)$, during a prior configuration phase, a plurality of test cell precursors is provided, analogous to the cell precursor 10. For each test precursor, the processing steps previously described E0 to E6 are implemented. The various test precursors are subjected to processing for various respective pairs of equilibration temperature and time $(T_{Ei}, \tau_i)$. During a later evaluation step, the efficiency of each test precursor is evaluated, for example by measuring, in a known manner, the lifetime of the minority carriers in the test cell precursor. Finally, the optimum pair of equilibration temperature $T_E$ and of equilibration time $\tau$ is selected corresponding to the best efficiency. As a variant, the efficiency of finished cells could be tested, carried out using the processed test precursors.

Figure 5:
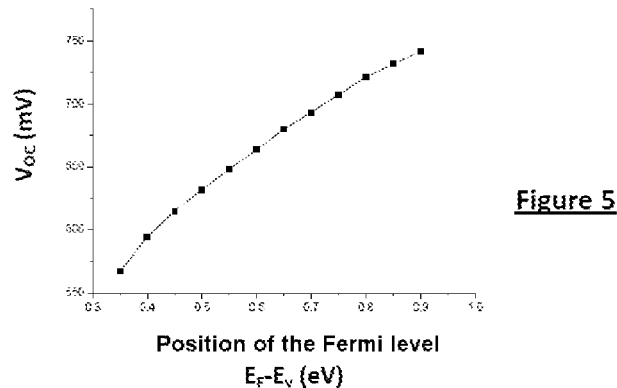
FIG. 5 shows the variation of the open-circuit electrical voltage of a photovoltaic cell fabricated according to the method of the invention, as a function of the modified position of the Fermi level during the processing.

FIG. 5 shows the variation of the open circuit electrical voltage $V_{OC}$, expressed in mV, of the finished cell 100 as a function of the position of the Fermi level relative to the valence band in the interface INT of the precursor 10 during the equilibration period (while heating to $T_E$ under an applied electrical voltage U1). The highest values of $V_{OC}$ are obtained for Fermi levels close to the middle of the band gap (the gap being 1.8 eV) during the heating under an applied electrical voltage.

It should be highlighted that it is thanks to the absence of current through the cell precursor 10 that, by application of the state change electrical voltage, it is possible to shift the Fermi level up to the desired position close to the middle of the gap.

After resetting the electrical voltage U across the terminals of the precursor 10 to zero, the method continues with a plurality of known steps for finishing the cell using the precursor 10. These steps comprise:
- a step E7 for deposition of the back layer 3 of doped amorphous silicon;
- a step E8 for deposition of the layers 5 and 6 of TCO;
- a metallization step E9 for forming the contacts 7A, 7B, 8A and 8B.

After the step E9, the finished photovoltaic cell is obtained 100.

The finishing steps E7 to E9 may be carried out after the processing steps E0 to E6 "en passant" (in other words without interrupting the fabrication process) or after interruption of the fabrication process. In the second case, the steps E0 to E6, on the one hand, and the steps E7 to E9, on the other, could be implemented respectively by two different actors in the fabrication sequence for the cell 100.

In the preceding description, the cell precursor 10 comprises a stacking of layers comprising a layer of doped crystalline silicon, an intermediate layer of intrinsic hydrogenated amorphous silicon and a top layer of doped hydrogenated amorphous silicon. This stack may be formed on the front face and/or on the back face of the cell 100. In one variant, the intermediate layer of amorphous silicon could be micro-doped. In another variant, the top layer of doped hydrogenated amorphous silicon is deposited directly onto the crystalline silicon, with no intrinsic or microdoped intermediate layer.

In order to also process the interface, denoted INT', between crystalline silicon and amorphous silicon at the separation between the central layer 1 and the bottom layer of amorphous silicon 3, steps analogous to the processing steps E1 to E6 could be carried out, by heating under an applied electrical voltage, with a cell precursor composed of the stack of layers comprising the central layer 1, the intermediate layer 4, the top layer 2 and the bottom layer 3. In this case, the processing of the interface INT and that of the interface INT' would be carried out one after the other. Where appropriate, the processing of these two interfaces INT and INT', by heating under an applied electrical voltage, could be carried out simultaneously if the respective dopings of the layers 1, 2 and 3 allow it.

An intermediate layer of intrinsic amorphous silicon could be interposed between the central layer 1 and the bottom layer of doped amorphous silicon.

The invention also relates to a piece of processing equipment, designed to be used during the fabrication of a heterojunction photovoltaic cell, comprising:
  the grounded conducting plate 11;
  the plate made of insulating material 12 coated with the conducting layer 13, the two plates 12, 13 being arranged to sandwich a photovoltaic cell precursor to be processed, for example the precursor 10;
  the electrical voltage generator 16 connected to the conducting layer 13;
  a heating device, for example the resistive element 110 powered by the current generator 15, integrated into the plate 11;
  a cooling device, for example the vessel 17 and means for making a cooling fluid circulate within this the vessel 17;
  a control module (not shown) designed to control the operation of the electrical voltage generator, of the heating device and of the cooling device in such a manner as to apply a state change electrical voltage U1 between the conducting metal layer 13 and ground, the electrical voltage U1 being designed to bring the Fermi level at the interface INT between crystalline silicon and amorphous semiconductor material closer to the middle of the band gap of the amorphous semiconductor material of the precursor, while at the same time heating the precursor to a defect equilibration temperature, then to cool down the precursor prior to interrupting the application of the said state change electrical voltage.

The invention claimed is:

1. A method for processing a precursor of a heterojunction photovoltaic cell, the precursor comprising at least one layer of doped crystalline silicon and a layer of doped amorphous semiconductor material, the method comprising:
  placing the cell precursor sandwiched between a grounded conducting plate and a plate made of insulating material coated with a conducting layer;
  applying a state change electrical voltage between the conducting layer and ground, the state change electrical voltage being designed to bring the Fermi level at an interface between crystalline silicon and amorphous semiconductor material closer to the middle of the band gap of the amorphous semiconductor material, while at the same time heating the cell precursor to a defect equilibration temperature;
  cooling down the cell precursor prior to interrupting the application of the state change electrical voltage.

2. The processing method as claimed in claim 1, wherein the equilibration temperature is higher than or equal to a defect equilibration threshold temperature below which the energy provided is insufficient to allow a modification of the defect density in the amorphous semiconductor.

3. The processing method as claimed in claim 1, wherein the equilibration temperature is higher than or equal to 150° C.

4. The method as claimed in claim 1, wherein the equilibration temperature is less than or equal to a maximum temperature beyond which the amorphous semiconductor would be degraded.

5. The method as claimed in claim 1, wherein the equilibration temperature is less than or equal to 300° C.

6. The method as claimed in claim 1, wherein, during the application of the state change electrical voltage, the cell precursor is heated to the equilibration temperature for an equilibration time, the temperature and equilibration time pair being chosen as a function of a desired efficiency, and wherein, in order to determine the temperature and equilibration time pair, during a prior configuration phase, a plurality of test cell precursors, analogous to the precursor of the cell to be fabricated, is provided and, for each test precursor, the steps are implemented for placing the test precursor sandwiched between a grounded support and a plate made of insulating material coated with a conducting metal layer, for applying a state change electrical voltage between the conducting metal layer and ground, while at the same time heating the test precursor to an equilibration temperature, and for cooling down the test precursor prior to interrupting the application of the state change electrical voltage, the various test precursors being tested for various respective pairs of temperature and of equilibration time, then the efficiency of each test precursor is evaluated and the optimum pair of temperature and of equilibration time is selected corresponding to the best efficiency obtained.

7. The method as claimed in claim 1, wherein the precursor is heated to the equilibration temperature with the application of the state change electrical voltage for an equilibration time in the range between 1 and 30 minutes.

8. The processing method as claimed in claim 1, wherein the assembly comprising the cell precursor, the conducting plate and the insulating plate coated with the conducting layer is placed in a vessel under a controlled atmosphere and, in order to cool down the precursor, a cooling fluid is circulated within the vessel.

9. The processing method as claimed in claim 1, wherein the insulating plate has a thickness greater than or equal to 100 nm.

10. A method of fabrication of a heterojunction photovoltaic cell, the method comprising:

providing a cell precursor comprising at least one layer of doped crystalline silicon and one layer of doped amorphous semiconductor material and implementing a processing method as claimed in claim 1, applied to the cell precursor.

11. The method of fabrication as claimed in claim 10, wherein, after cooling down the cell precursor and interruption of the state change electrical voltage, the method of fabrication comprises depositing at least one layer of electrically-conducting material and performing a metallization in order to form electrical contacts.

12. The processing method as claimed in claim 2, wherein the equilibration temperature is higher than or equal to 150° C.

13. The method as claimed in claim 2, wherein the equilibration temperature is less than or equal to a maximum temperature beyond which the amorphous semiconductor would be degraded.

14. The method as claimed in claim 3, wherein the equilibration temperature is less than or equal to a maximum temperature beyond which the amorphous semiconductor would be degraded.

15. The method as claimed in claim 2, wherein the equilibration temperature is less than or equal to 300° C.

16. The method as claimed in claim 3, wherein the equilibration temperature is less than or equal to 300° C.

17. The method as claimed in claim 4, wherein the equilibration temperature is less than or equal to 300° C.

18. The method as claimed in claim 2, wherein, during the application of the state change electrical voltage, the cell precursor is heated to the equilibration temperature for an equilibration time, the temperature and equilibration time pair being chosen as a function of a desired efficiency, and wherein, in order to determine the temperature and equilibration time pair, during a prior configuration phase, a plurality of test cell precursors, analogous to the precursor of the cell to be fabricated, is provided and, for each test precursor, the steps are implemented for placing the test precursor sandwiched between a grounded support and a plate made of insulating material coated with a conducting metal layer, for applying a state change electrical voltage between the conducting metal layer and ground, while at the same time heating the test precursor to an equilibration temperature, and for cooling down the test precursor prior to interrupting the application of the state change electrical voltage, the various test precursors being tested for various respective pairs of temperature and of equilibration time, then the efficiency of each test precursor is evaluated and the optimum pair of temperature and of equilibration time is selected corresponding to the best efficiency obtained.

19. The method as claimed in claim 3, wherein, during the application of the state change electrical voltage, the cell precursor is heated to the equilibration temperature for an equilibration time, the temperature and equilibration time pair being chosen as a function of a desired efficiency, and wherein, in order to determine the temperature and equilibration time pair, during a prior configuration phase, a plurality of test cell precursors, analogous to the precursor of the cell to be fabricated, is provided and, for each test precursor, the steps are implemented for placing the test precursor sandwiched between a grounded support and a plate made of insulating material coated with a conducting metal layer, for applying a state change electrical voltage between the conducting metal layer and ground, while at the same time heating the test precursor to an equilibration temperature, and for cooling down the test precursor prior to interrupting the application of the state change electrical voltage, the various test precursors being tested for various respective pairs of temperature and of equilibration time, then the efficiency of each test precursor is evaluated and the optimum pair of temperature and of equilibration time is selected corresponding to the best efficiency obtained.

20. A piece of equipment for processing a precursor of a heterojunction photovoltaic cell, comprising:

a grounded conducting plate;

a plate made of an insulating material coated with a conducting layer, the two plates being arranged to sandwich a photovoltaic cell precursor to be processed, the precursor comprising at least one layer of doped crystalline silicon and one layer of doped amorphous semiconductor material;

an electrical voltage generator connected to the conducting layer;

a heating device;

a cooling device;

a control module designed to control the operation of the electrical voltage generator, of the heating device and of the cooling device so as to apply a state change electrical voltage between the conducting layer and ground, the state change electrical voltage being designed to bring the Fermi level at an interface between crystalline silicon and amorphous semiconductor material closer to the middle of the band gap of the amorphous semiconductor material, while at the same time heating the cell precursor to a defect equilibration temperature, then to cool down the precursor prior to interrupting the application of the state change electrical voltage.

* * * * *